(12) United States Patent
Lin et al.

(10) Patent No.: US 11,769,716 B2
(45) Date of Patent: Sep. 26, 2023

(54) SEMICONDUCTOR DEVICE AND METHODS OF FORMING THE SAME

(71) Applicant: Taiwan Semiconductor Manufacturing Company, Ltd., Hsinchu (TW)

(72) Inventors: Yung-Sheng Lin, Hsinchu County (TW); Cheng-Lung Yang, Kaohsiung (TW); Chin-Yu Ku, Hsinchu (TW); Ming-Da Cheng, Taoyuan (TW); Wen-Hsiung Lu, Tainan (TW); Tang-Wei Huang, Hsinchu (TW); Fu Wei Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 107 days.

(21) Appl. No.: 17/213,200

(22) Filed: Mar. 25, 2021

(65) Prior Publication Data

US 2022/0310492 A1    Sep. 29, 2022

(51) Int. Cl.
| | | |
|---|---|---|
| *H01L 23/495* | (2006.01) | |
| *H01L 23/48* | (2006.01) | |
| *H01L 21/768* | (2006.01) | |
| *H01L 21/48* | (2006.01) | |
| *H01L 23/00* | (2006.01) | |

(52) U.S. Cl.
CPC .... *H01L 23/49548* (2013.01); *H01L 21/4821* (2013.01); *H01L 21/76898* (2013.01); *H01L 23/481* (2013.01); *H01L 23/49565* (2013.01); *H01L 23/562* (2013.01)

(58) Field of Classification Search
CPC ......... H01L 23/00; H01L 23/13; H01L 23/48; H01L 23/495; H01L 23/481; H01L 23/562; H01L 23/49548; H01L 23/49565; H01L 29/06; H01L 29/0657; H01L 21/48; H01L 21/768; H01L 21/4821; H01L 21/76898
USPC ........................................................ 257/774
See application file for complete search history.

(56) References Cited

U.S. PATENT DOCUMENTS

| 2012/0126386 A1* | 5/2012 | Bolken | H01L 23/48 257/680 |
|---|---|---|---|
| 2013/0329376 A1* | 12/2013 | Racz | H01L 24/24 361/728 |

\* cited by examiner

*Primary Examiner* — Chuong A Luu
(74) *Attorney, Agent, or Firm* — JCIPRNET

(57) ABSTRACT

A semiconductor device and method of forming the same are provided. The semiconductor device includes at least one substrate and an interconnection structure. The at least one substrate has a cavity partially defined by an inner sidewall of the at least one substrate and a channel disposed at a bottom of the at least one substrate. The channel laterally penetrates through the at least one substrate. The interconnections structure is disposed over the substrate, and the interconnection structure has a through hole penetrating through the interconnection structure. The through hole, the cavity and the channel are in spatial communication with each other.

20 Claims, 14 Drawing Sheets

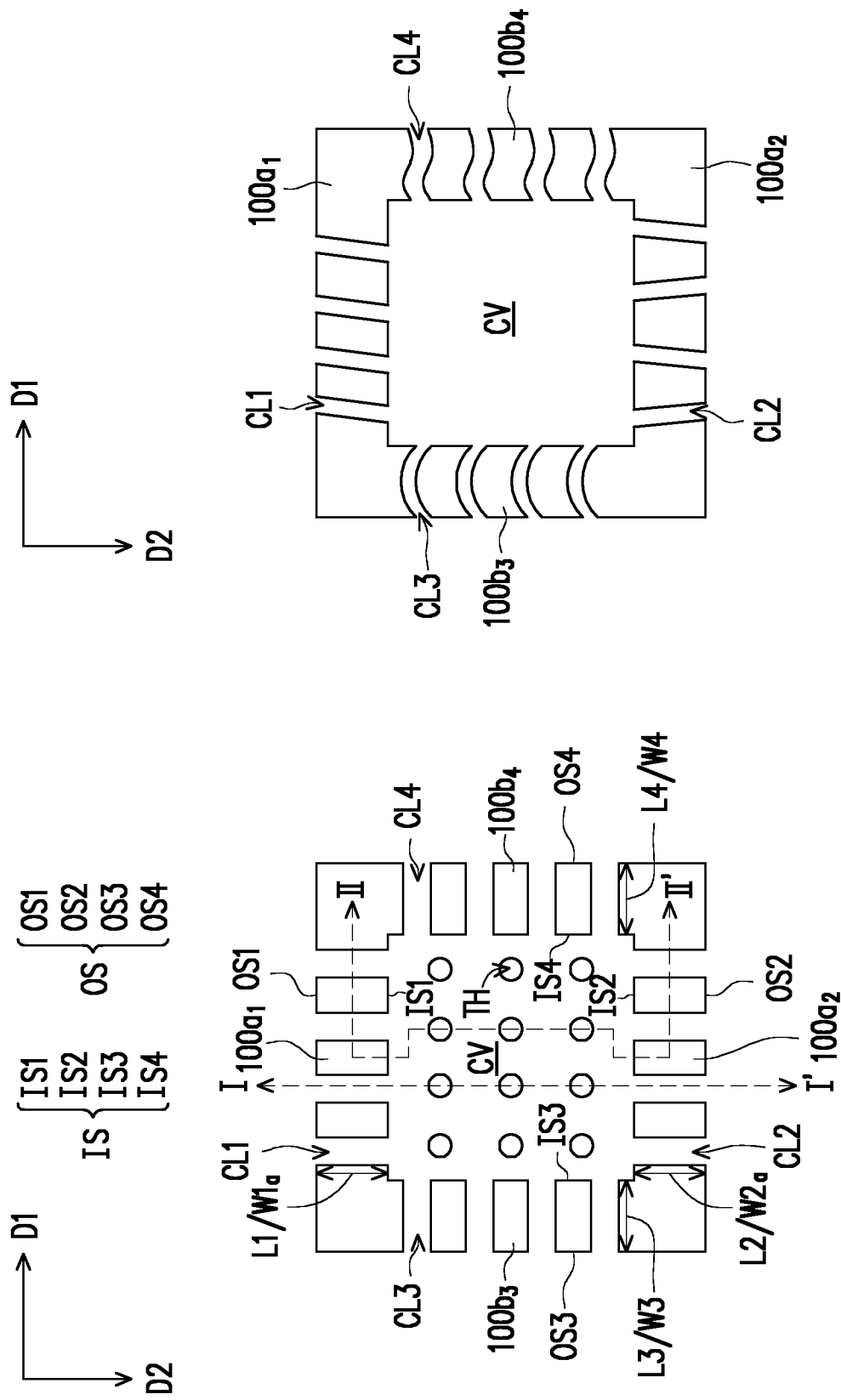

SEMICONDUCTOR DEVICE AND METHODS OF FORMING THE SAME

BACKGROUND

Micro electro mechanical system (MEMS) devices are a recent development in the field of integrated circuit technology and include devices fabricated using semiconductor technology to form mechanical and electrical features. Examples of MEMS devices include gears, levers, valves, and hinges. Common applications of MEMS devices include accelerometers, pressure sensors, actuators, mirrors, heaters, and printer nozzles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 3A to FIG. 3D illustrates bottom views of a semiconductor device according to various embodiments of the disclosure.

DETAILED DESCRIPTION

Figure 1:
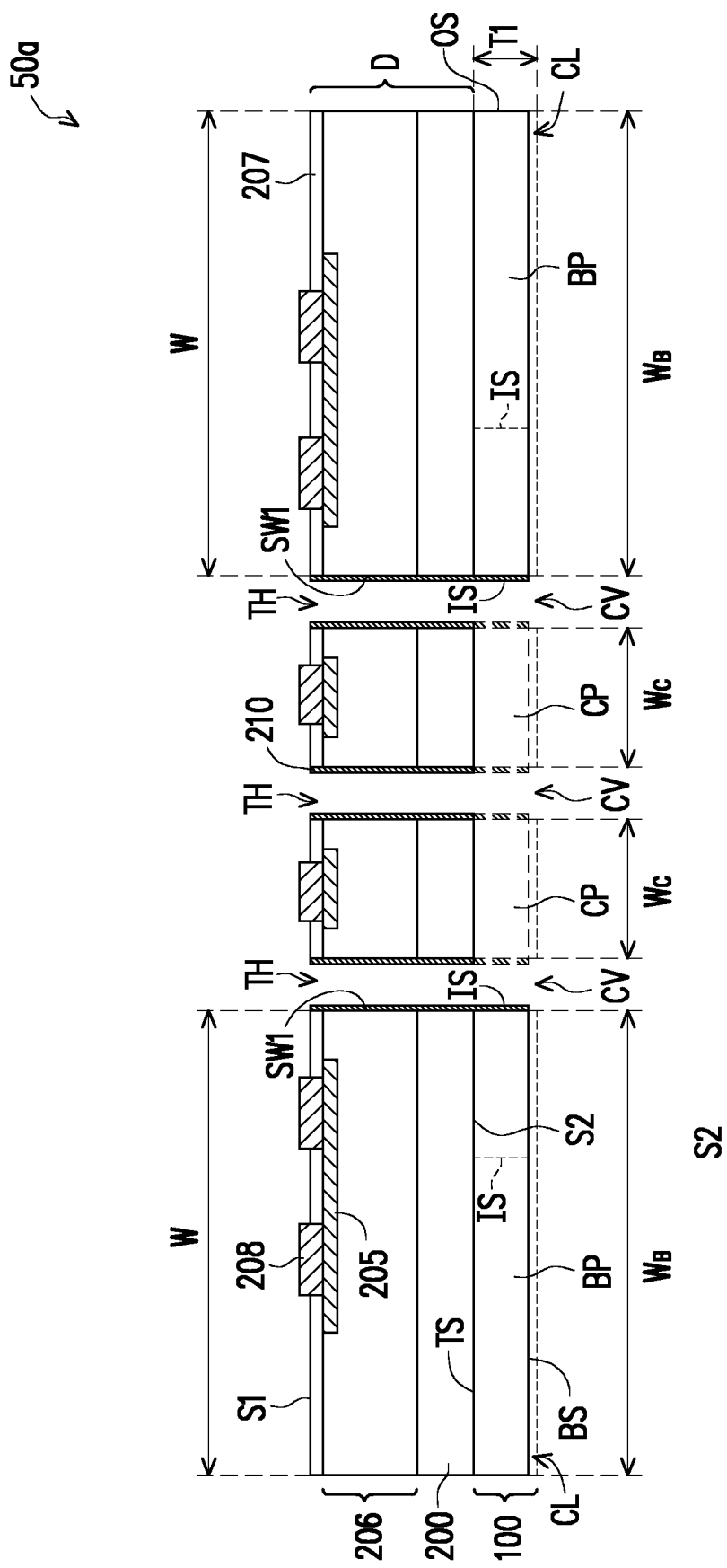
FIG. 1 illustrates a schematic cross-sectional view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of the disclosure are directed to provide a semiconductor device including channels disposed at the bottom or backside thereof, which is advantage for stress reduction and chemical drain. Although a MEMS device including the channels is used as example to explain the concept of the disclosure, the embodiments of the disclosure are readily applicable to other types of semiconductor devices. The other types of semiconductor devices may include 3D stacked device, package structure, or the like, or any other suitable semiconductor device.

Figure 2A:
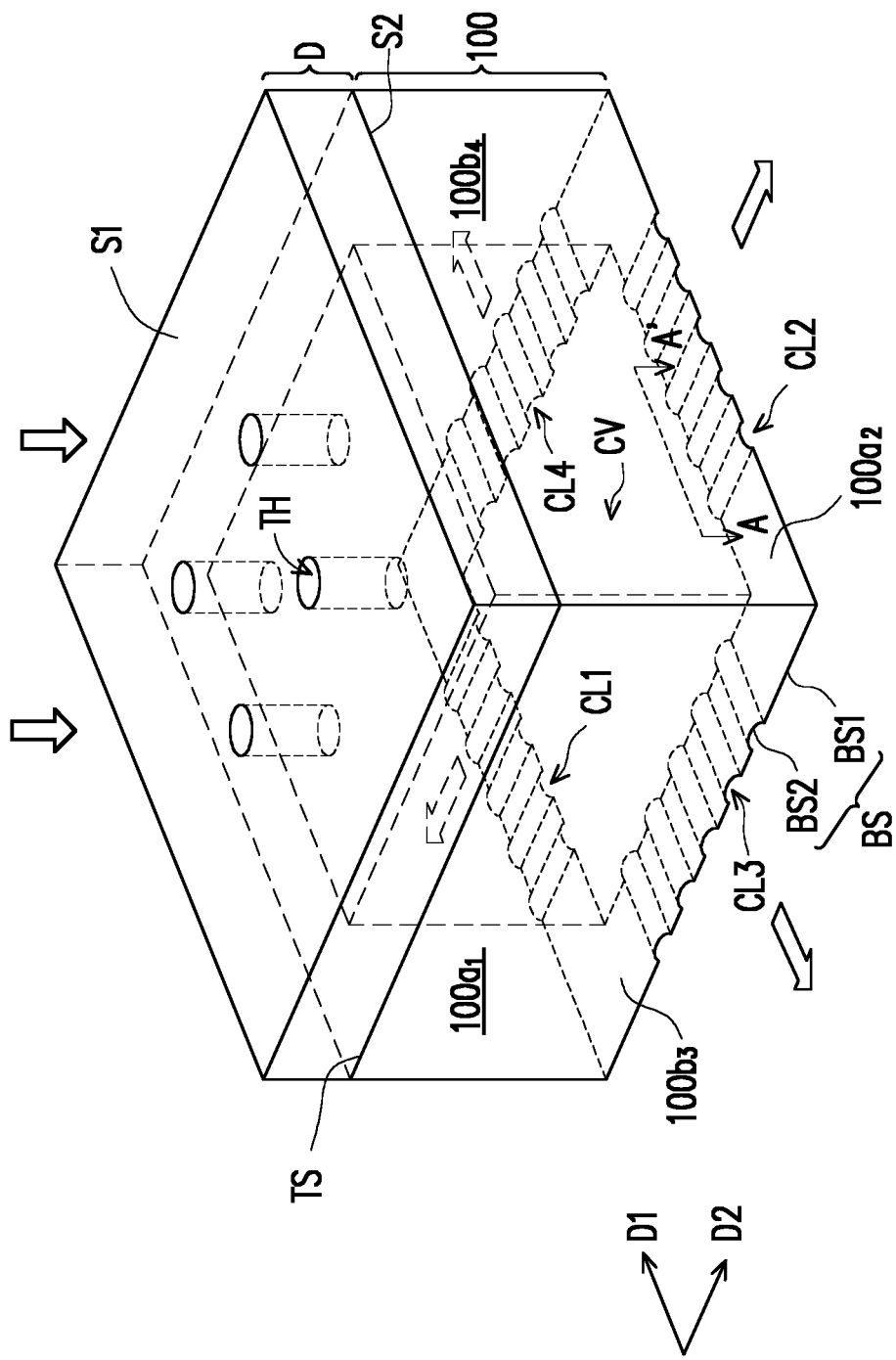
FIG. 2A illustrates a perspective view of a semiconductor device according to some embodiments of the disclosure.
Figure 2B:
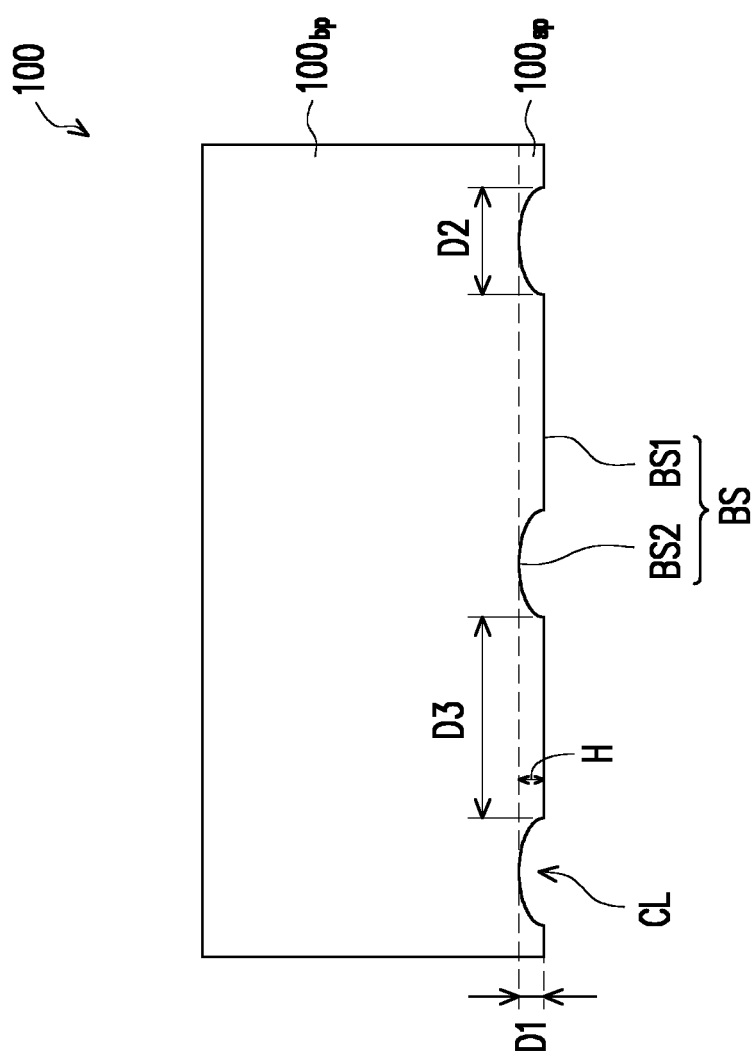
FIG. 2B illustrates an enlarged cross-sectional view taken along A-A' line of FIG. 2A.

FIG. 1 illustrates a schematic cross-sectional view of a semiconductor device according to some embodiments of the disclosure. FIG. 2A illustrates a perspective view of the semiconductor device of FIG. 1 according to some embodiments of the disclosure. FIG. 2B illustrates an enlarged cross-sectional view of a portion of the semiconductor device according to some embodiments of the disclosure. FIG. 3A illustrates a bottom view of the semiconductor device of FIG. 1 according to some embodiments of the disclosure, and FIG. 1 is a cross-sectional view taken along I-I' line of FIG. 3A.

Referring to FIG. 1, in some embodiments, a semiconductor device 50a includes a substrate 100, and a die D disposed on the substrate 100. The die D may include a substrate 200, an interconnection structure 206, a passivation layer 207 and a plurality of conductive connectors 208. The substrate 100 may also be referred to as a base substrate, a frame or a first substrate. In some embodiments, the substrate 100 includes a semiconductor material, such as silicon. Other suitable materials such as glass, ceramic may also be used for the substrate 100 in some alternative embodiments.

The die D is a device die including various devices therein. In some embodiments, the die D may be an application-specific integrated circuit (ASIC) chip, system on chip (SoC), an analog chip, a sensor chip, a wireless and radio frequency chip, a voltage regulator chip or a memory chip or any other suitable chip.

In some embodiments, the substrate 200 of the die D is disposed on the substrate 100 and may be bonded to the substrate 100 through a bonding structure (now shown). In other words, a bonding structure may be disposed between the substrate 100 and the substrate 200. The bonding structure may be a single-layer structure or a multi-layer structure. In some embodiments, the bonding structure includes a first bonding film and a second bonding film on the first bonding film (not shown). The first bonding film and the second bonding film may be disposed on and in contact with the substrate 100 and the substrate 200, respectively. The bonding structure may include a dielectric material such as silicon oxide, silicon nitride or a combination thereof.

The material of the substrate 200 may be the same as or different from that of the substrate 100. For example, the substrate 100 is a semiconductor substrate, such as a bulk semiconductor substrate, a semiconductor-on-insulator (SOI) substrate, or the like, which may be doped (e.g., with a p-type or an n-type dopant) or undoped. The substrate 200 may be a silicon substrate. Other substrates, such as a multi-layered or gradient substrate may also be used. In some embodiments, the semiconductor material of the substrate 200 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof. In some embodiments, the substrate 100 includes undoped silicon, while the substrate 200 includes doped silicon, but the disclosure is not limited thereto. Each of the substrates 100 and 200 may be doped or undoped.

In some embodiments, a plurality of devices (not shown) may be disposed on and/or in the substrate 200. The devices may include active devices, passive devices or combinations thereof. In some embodiments, the devices may include complementary metal oxide semiconductor (CMOS) devices, transistors, capacitors, resistors, diodes, photodiodes, fuse devices, or the like, or combinations thereof. The details of the devices are not illustrated herein for the sake of brevity.

The interconnection structure 206 is disposed over the substrate 200 to electrically connect the various devices in and/or on the substrate 200 to form a functional circuit. The interconnection structure 206 may include a plurality of conductive features embedded in a dielectric structure. The dielectric structure may include a plurality of dielectric layers, such as inter-layer dielectric layers (ILDs) and inter-metal dielectric layers (IMDs). The material of the dielectric structure may include silicon oxide, silicon nitride, silicon oxynitride, silicon carbide, low-K dielectric material, such as un-doped silicate glass (USG), phosphosilicate glass (PSG), boron-doped phosphosilicate glass (BPSG), fluorinated silica glass (FSG), $SiO_xC_y$, Spin-On-Glass, combinations thereof, or the like.

The conductive features are interconnected to each other and embedded in the dielectric structure. In some embodiments, the conductive features may include conductive contacts, and multi-layers of conductive lines and conductive vias stacked on one another. The conductive contacts may be formed in the ILDs to electrically connect the conductive lines to the devices formed in and/or on the substrate 200; the conductive vias may be formed in the IMDs to electrically connect the conductive lines in different layers. The conductive features may include metal, metal alloy or a combination thereof. For example, the conductive features may include tungsten (W), copper (Cu), copper alloys, aluminum (Al), aluminum alloys, or combinations thereof. For the sake of brevity, the structure of the multi-layers of dielectric layers and conductive features are not specifically shown in the figures, and top conductive features 205 of the interconnector structure 206 are shown for illustration.

In some embodiments, a passivation layer 207 is disposed on the interconnection structure 206 to cover top conducive features 205 and the dielectric structure of the interconnection structure 206. The passivation layer 207 may include dielectric material(s) such as silicon nitride, silicon oxynitride, or a polymer material such as polyimide (PI), polybenzoxazole (PBO), benzocyclobutene (BCB), or the like, or combinations thereof. The passivation layer 207 may include a single-layer structure or a multi-layer structure.

A plurality of the conductive connectors 208 are disposed on and electrically connected to the interconnection structure 206. The conductive connectors 208 may penetrate through the passivation layer 207 to connect to the conductive features of the interconnection structure 206. The sidewalls of the conductive connectors 208 may be partially or completely covered by the passivation layer 207. In some embodiments, the conductive connectors 208 land on the top conductive features 205 of the interconnection structure, but the disclosure is not limited thereto. The conductive connectors 208 may include suitable metallic pads and/or metallic bumps or pillars, such as aluminum pads, copper pillars or bumps, gold bumps, or the like, or combinations thereof, or any other suitable connectors. The conductive connectors 208 may have the same heights or different heights depending on the product design and requirement.

In some embodiments, the die D includes one or more through hole TH penetrating through the die D and extending from a first surface S1 to a second surface S2 of the die D. In some embodiments, the through holes TH are defined by sidewalls of the passivation layer, sidewalls of (e.g., the dielectric layers of) the interconnection structure 206 and sidewalls of the substrate 200. The first surface S1 may be an active surface (or front surface) of the die D; the second surface S2 is opposite to the first surface S1 and may be the back surface of the die D. Herein, the active surface (or front surface) of the die D refers to the surface having connectors or close to the connectors, and the back surface of the die D may be a surface of the substrate 200.

Still referring to FIG. 1, in some embodiments, the substrate 100 includes one or more cavity CV disposed under and in spatial communication with the through holes TH of the die D. In some embodiments, the substrate 100 includes a body part BP and a center part CP. The body part BP is disposed underlying edge portions and/or portions adjacent to the edge portions of the die D. The center part CP is disposed underlying center portions of the die D. The one or more cavity CV is/are defined by inner sidewalls IS of the body part BP and/or the sidewalls of the center part CP. The sidewalls IS of the body part BP of the substrate 100 may be substantially aligned with (see the sidewall IS shown in solid line) or laterally shift from (see the sidewall IS shown in dotted line) the sidewalls SW1 of the die D. Although the sidewall IS of the substrate 100 is shown as substantially straight, the disclosure is not limited thereto. In some embodiments, the sidewall IS of the substrate 100 may be slanted. For example, the body part BP of the substrate 100 may be tapered in a direction away from the substrate 200. In other words, the width $W_B$ of the body part BP may gradually increase as approaching the substrate 200.

In some embodiments, the width $W_B$ of the body part BP may substantially equal to or less than the width W of the corresponding portion of the die D. The width $W_B$ of the body part BP may range from 2000 μm to 4000 μm. The thickness T1 of the body part BP may range from 50 μm to 770 μm. In some embodiments, the width $W_C$ of the center part CP may range from 10 μm to 200 μm, and the thickness of the center part CP may range from 0 μm to 770 μm.

In other words, in some embodiments in which the center part CP has non-zero thickness, the substrate 100 may include a plurality of cavities CV defined by sidewalls of the body part BP and the center part CP, and the number of the cavities CV may be equal to or different from the number of the through holes TH. Each of the cavities CV may be disposed under the corresponding one or more of the through holes TH. In some other embodiments in which the thickness of the center part CP is 0 (that is, the substrate 100 merely include the body part BP and is free of center part CP), the substrate 100 may include one single cavity CV defined by the sidewall IS of the body part BP and a portion of the second surface S2 of the die D, and the one single cavity CV is in spatial communication with the plurality of through holes TH of the die D.

In some embodiments, a liner 210 is disposed to line the surfaces of the through holes TH and the cavity (or cavities) CV. That is to say, the liner 210 may cover and contact the sidewalls of passivation layer 206, sidewalls of the dielectric layers of the interconnection structure 206, sidewalls and/or second surface S2 of the substrate 200 and sidewalls of the substrate 100 exposed by or defining the through holes TH and the cavity (or cavities) CV. In some embodiments, the liner 210 includes a conductor, such as a metallic film. The liner 210 may include a suitable meatal, metal alloy, or a combination thereof. For example, the liner 210 may include Ti/Au, Ti/Pt, Ta/Au, Cr/Au, or the like, or combinations thereof. In some embodiments, the liner 210 is electrically floating, that is, the liner 210 is electrically isolated from the conductive features or devices included in the semiconductor device 50a. In some embodiments, the liner 210 may further line the surfaces of the channels CL.

In some embodiments, a plurality of channels CL are disposed at the bottom of the substrate 100 and in spatial communication with the cavity (or cavities) CV. The channels CL, the cavity CV and the through holes TH will be described in detail as below with the accompanying perspective view and bottom view. It is noted that, the numbers, shapes and sizes of the through holes TH, cavity CV, and channels CL shown in various figures of the disclosure are merely for illustration, and the disclosure is no limited thereto. The through holes TH, cavity CV, and channels CL may have any suitable numbers, shapes and sizes depending on product design and requirement.

FIG. 2A illustrates a perspective view of a semiconductor device 50a according to an exemplary embodiment in which the thickness of the center part CP is zero, and the width $W_B$ of the substrate 100 is less than the width W of the die D. FIG. 2B is an enlarged cross-sectional view of the substrate 100 of the semiconductor device 50a taken along A-A' line of FIG. 2A. FIG. 3A is a bottom view of the semiconductor device 50a of FIG. 2A taken along a plane where the bottommost surface BS1 of the substrate 100 is located. In order to schematically illustrates the channels, cavity, and through holes, FIG. 3A further illustrates the projection of the through holes on the plane as dashed line. It is noted that, some components of the die D are not specifically shown in FIG. 2A, and fewer through holes or channels are illustrated in FIG. 2A FIG. 3A for the sake of brevity and clarity.

Referring to FIG. 1, FIG. 2A, and FIG. 3A, in some embodiments, the substrate 100 merely includes the body part BP (FIG. 1) and is free of the center part CP (FIG. 1). The substrate 100 is a hollow ring-shaped structure with a cavity CV. The hollow ring-shaped structure may include square ring-shaped, rectangle ring-shaped, circular ring-shaped, or any other suitable ring-shaped.

In some embodiments, the substrate 100 includes first portions $100a_1$, $100a_2$ and second portions $100b_3$, $100b_4$ connected to each other. The first portions $100a_1$, $100a_2$ may be parallel with each other and extend in a first direction D1. The second portions $100b_3$, $100b_4$ are parallel with each other and extend in a second direction D2. In some embodiments, the first direction D1 is perpendicular to the second direction D2. The first portion $100a_1$ has opposite sidewalls OS1 and IS1, the first portion $100a_2$ has opposite sidewalls OS2 and IS2, the second portion $100b_3$ has opposite sidewalls OS3 and IS3, the second portion $100b_4$ has opposite sidewalls OS4 and IS4. The sidewalls OS1, OS2, OS3, OS4 are connected to each other and constitute the outer sidewalls OS of the substrate 100, and the sidewalls of IS1, IS2, IS3, IS4 are connected to each other and constitute the inner sidewalls IS of the substrate 100. In some embodiments, the inner sidewalls IS of the substrate 100 and a portion of the second surface S2 of the die D define the cavity CV. The cavity CV penetrates through the substrate 100 and extends from a first surface (e.g. top surface) TS to a second surface (e.g. bottom surface) BS of the substrate 100.

In some embodiments, the substrate 100 includes a plurality of channels CL at the bottom thereof. The channels CL are in spatial communication with the cavity CV and the through holes TH. The channels CL are hollow channels and may be spaced from each other by the substrate 100.

In alternative embodiments, some of the channels CL may intersect each other. The channels CL serve as outlets or exports, which are configured for discharging fluid outside the semiconductor device 50. The fluid may be process residues or byproducts, or the like, or combinations thereof, which may be generated from processes performed on features over the through holes TH. In some embodiments, the fluid may include etchant, cleaning agent, or the like. When discharging fluid, as shown by the arrows in FIG. 2, the fluid may flow into the through holes TH, then into the cavity CV, and then flow out of the semiconductor device 50a through the channels CL. When they are not discharging fluid, the through holes TH, cavity CV and channels CL may be filled with air, vacuum, and/or another gas depending on the atmosphere surrounding the semiconductor device 50.

The channels CL may be recesses, holes, trenches, or the like or combinations thereof. The channels CL laterally penetrates through the substrate 100 in a direction parallel with the top surface TS of the substrate 100, and extends from inner sidewall IS to outer sidewall OS of the substrate 100. The channel CL may also be referred to as a through substrate channel. In some embodiments in which the substrate 100 is a silicon substrate, the channel CL may also be referred to as a silicon channel, or through silicon channel. In some embodiments, the channels CL are recesses, which are recessed from the bottommost surface BS1 of the substrate 100 and toward the top surface TS of the substrate 100.

As shown in FIG. 2A, the channels CL are defined by surfaces BS2 of the substrate 100. In some embodiments, the surfaces BS2 and the bottommost surface BS1 constitute the bottom surface BS of the substrate 100. In other words, the substrate 100 includes first bottom surfaces BS1 and second bottom surfaces BS2. In some embodiments, the first bottom surfaces BS1 are located at a substantially planar plane and coplanar with each other, while the second bottom surfaces BS2 are recessed from the first bottom surface BS1 and toward the top surface TS of the substrate 100. That is to say, the second bottom surfaces BS2 are located at a level height higher than that of first bottom surfaces BS1. The thickness (from the top surface TS to the surface BS2) of the substrate 100 over the channel CL is less than the thickness (from the top surface TS to the bottommost surface BS1) of the substrate 100.

From another point of view, referring to FIG. 2B, the substrate 100 includes a base part $100_{bp}$ and a plurality of segments $100_{sp}$. The base part $100_{bp}$ has a substantially uniform thickness. The segments $100_{sp}$ are located underlying the base part $100_{bp}$ and spaced from each other by the channels CL therebetween. The height H of the segment $100_{sp}$ is equal to the height D1 of the channel CL. In other words, the channels CL are defined by lateral surfaces of the segments SP and/or the bottom surface of the base part $100_{bp}$. In some embodiments, the cross-sectional shape of the channel CL may be arced, arched, semicircular, semi-oval shaped, or the like, but the disclosure is not limited thereto. In alternative embodiments, the cross-sectional shape of the channel CL may be square, rectangle, trapezoid, or the like, or any other suitable shape. The heights D1 of different channels CL may be substantially equal to each other or different from each other.

Still referring to FIG. 2B, in some embodiments, the channel CL has a height D1 and a width D2. Herein, the height D1 of the channel CL refers to the vertical distance from the bottommost surface BS1 to a topmost point of the surface BS2 in a direction perpendicular to the bottommost surface BS1, and the width D2 of the channel CL refers to a bottom width or a largest width of the channel CL. In some embodiments, the channel CL has a sufficient width D2 to facilitate the discharging of fluid out of the semiconductor device 50a through the channels CL. If the channel CL has a very small width, fluid may be stuck in the channel by capillary action, which is disadvantage for the discharging of fluid. In some embodiments, the width D2 of the channel CL is larger than the height D1 of the channel CL, but the disclosure is not limited thereto. The width D2 may be less than or equal to the height D1 as long as the size of the channel CL can avoid occurrence of capillary action. For example, the width D2 of the channel CL may range from 30 μm to 200 μm, and the height D1 of the channel CL may range from 20 μm to 200 μm.

The segment $100_{sp}$ has a width D3. Herein, the width D3 refers to the bottom width or the smallest width of the segment $100_{sp}$. In some embodiments, the segment $100_{sp}$ has a sufficient size (e.g. sufficient width D3) to avoid collapse or crack of substrate 100. In some embodiments, the width D3 of the segment is larger than the width D2 of the channel CL, but the disclosure is not limited thereto. As long as the sizes (e.g. widths D3) of the segments SP are sufficient to support the overlying body part BP and avoid collapse or crack of the substrate 100, the segment SP may have any suitable size (e.g. width D3), which may also be less than or equal to the size (e.g. width D2) of the channel CL.

In some embodiments, as shown in FIG. 2A and FIG. 3A, the channels CL may be disposed as extending in a direction parallel with or perpendicular to corresponding sidewalls of the substrate 100. For example, the channels CL1 and CL2 in the first portions $100a_1$ and $100a_2$ of the substrate 100 extend in the direction D2 parallel with the sidewalls OS3, OS4, IS3, IS4 and perpendicular to the sidewalls OS1, IS1, OS2, IS2 of the substrate 100. The channels CL3 and CL4 in the second portions $100b_3$ and $100b_4$ of the substrate 100 extend in the direction D1 parallel with the sidewalls OS1, IS1, OS2, IS2 and perpendicular to the sidewalls OS3, OS4, IS3, IS4 of the substrate 100. In other words, each of the channels CL may extend in a widthwise direction of the corresponding portion of the substrate 100, but the disclosure is not limited thereto. The channels CL1 extend from the inner sidewall IS1, through the first portion $100_{a1}$ of the substrate 100 to the outer sidewall OS1 of the substrate 100. The channels CL2 extend from the inner sidewall IS2, through the first portion $100_{a2}$ of the substrate 100 to the outer sidewall OS2 of the substrate 100. The channels CL3 extend from the inner sidewall IS3, through the second portion $100_{b3}$ of the substrate 100 to the outer sidewall OS3 of the substrate 100. The channels CL4 extend from the inner sidewall IS4, through the second portion $100_{b4}$ of the substrate 100 to the outer sidewall OS4 of the substrate 100.

In some embodiments, the lengths L1, L2, L3, L4 of the channels CL1, CL2, CL3, CL4 may be substantially equal to the widths $W1_a$, $W2_a$, W3, W4 of the corresponding portions $100a_1$, $100a_2$, $100a_3$, $100a_4$ of the substrate 100, respectively. The widths $W1_a$, $W2_a$, W3, W4 of the portions $100a_1$, $100a_2$, $100a_3$, $100a_4$ refers to the distance between the corresponding inner sidewall IS and outer sidewall OS in the direction D1 or D2. However, the disclosure is not limited thereto.

In some other embodiments, the channels CL may be not extend in a direction parallel with or perpendicular to the corresponding sidewalls of the substrate 100. Each of the channels CL may extend in any suitable direction, have any suitable extending path, shape and/or size, as long as the channels CL laterally extend through the substrate 100 and fluid can be discharged out of the semiconductor device through the channel CL. Further, different channels or adjacent channels may extend in different directions and have different paths. In some embodiments, different channels may intersect and in spatial communication with each other. The extending paths of the channels CL are not limited in the disclosure.

Figure 3D:
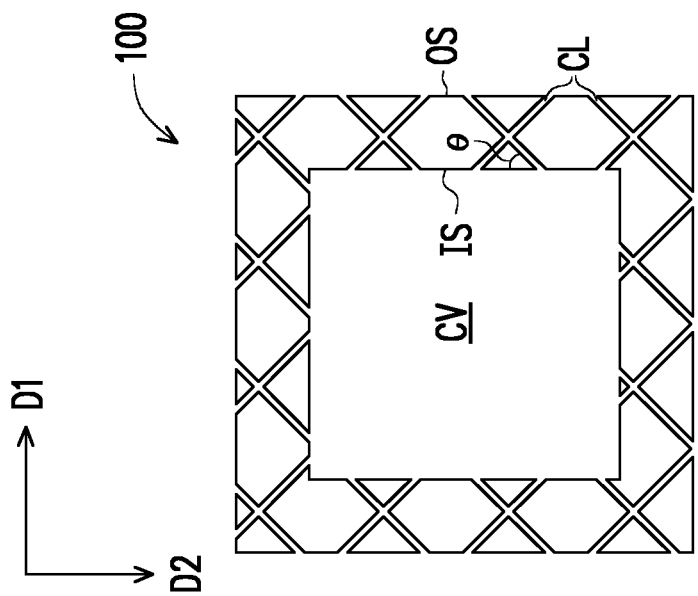
Figure 3C:
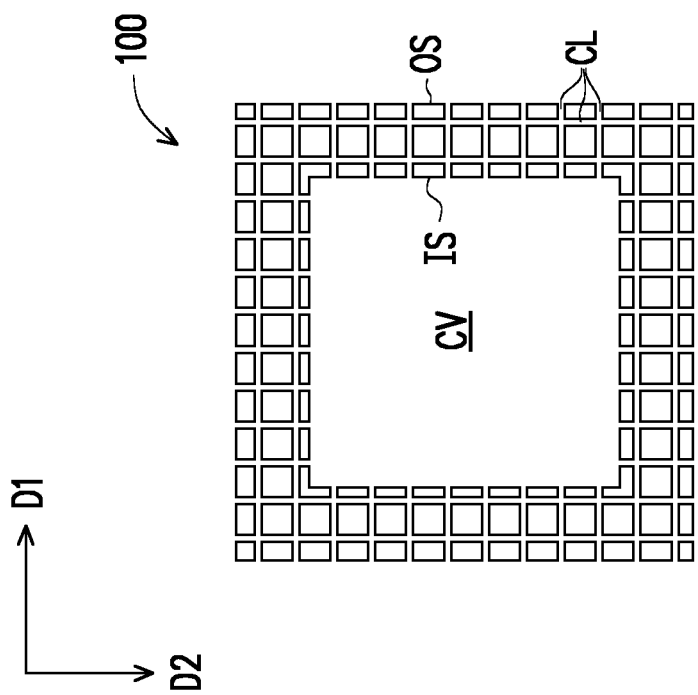

FIG. 3B to FIG. 3D are bottom views of the semiconductor device 50a illustrating various configurations of the channels CL according to some alternative embodiments of the disclosure. It is noted that, through holes are not shown in FIG. 3B to FIG. 3D for the sake of brevity.

Referring to FIG. 3B, in some embodiments, the channels CL may have different shapes, and the extending directions of the channels CL may be different from the extending directions of corresponding sidewalls.

Referring to FIG. 3C, in some embodiments, the channels CL may be configured as a grid pattern. Some of the channels intersect and spatially communicates with each other. Each of the channels CL extends from an edge of the substrate 100 to another edge of the substrate 100 and may extend in a directions parallel with or perpendicular to the extending directions D1 or D2 of corresponding sidewalls IS/OS. Some of the channels (or referred to as first channels) CL extend from inner sidewall IS to outer sidewall OS, while some other channels (or referred to as second channels) CL may extend from an outer sidewall OS to another outer sidewall OS and intersect the first channels.

Referring to FIG. 3D, in some embodiments, the channels CL may extend in a direction different from the direction D1 or D2. For example, an included angle θ between the channel CL and the inner sidewall IS of the substrate 100 may be non-right angle. In an embodiment, the angle θ may be an acute angle, such as 45°. However, the disclosure is not limited thereto.

The foregoing configurations of the channels CL are merely for illustration, it will be appreciated that other configurations for the channels disposed at the bottom of the substrate are also within the scope of the disclosure.

In some embodiments, the above-described semiconductor device 50a may also be referred to as a microelectromechanical system (MEMS) device or a 3D stacked device. In some embodiments, the semiconductor device 50a may be used in optical and/or electronic application, such as electron/light filter, electric current regulator, mask aligner or the like. For example, the semiconductor device 50a may be coupled to light generator and used for control the traveling path and flux of light. In some embodiments, light from the light generator may enter into the semiconductor device 50a from the back side thereof, then travel through the cavity CV and exit the semiconductor devices 50a through the plurality of through holes TH. In some embodiments, the conductive liner 210 lining the cavity CV and the through holes TH may be used for avoiding electron from being trapped in the cavity or through holes. However, the application of the semiconductor device is not limited thereto.

Figure 4A:
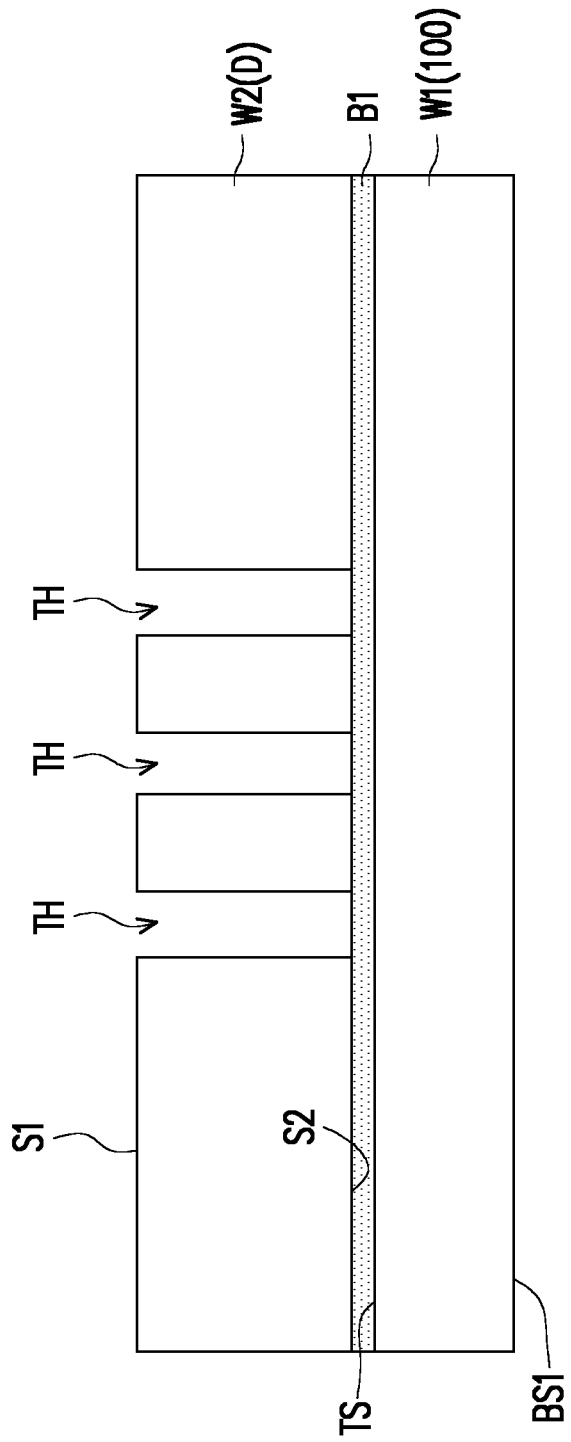
FIG. 4A to FIG. 4G are schematic cross-sectional views illustrating a method of forming a semiconductor device according to some embodiments of the disclosure.
Figure 4B:
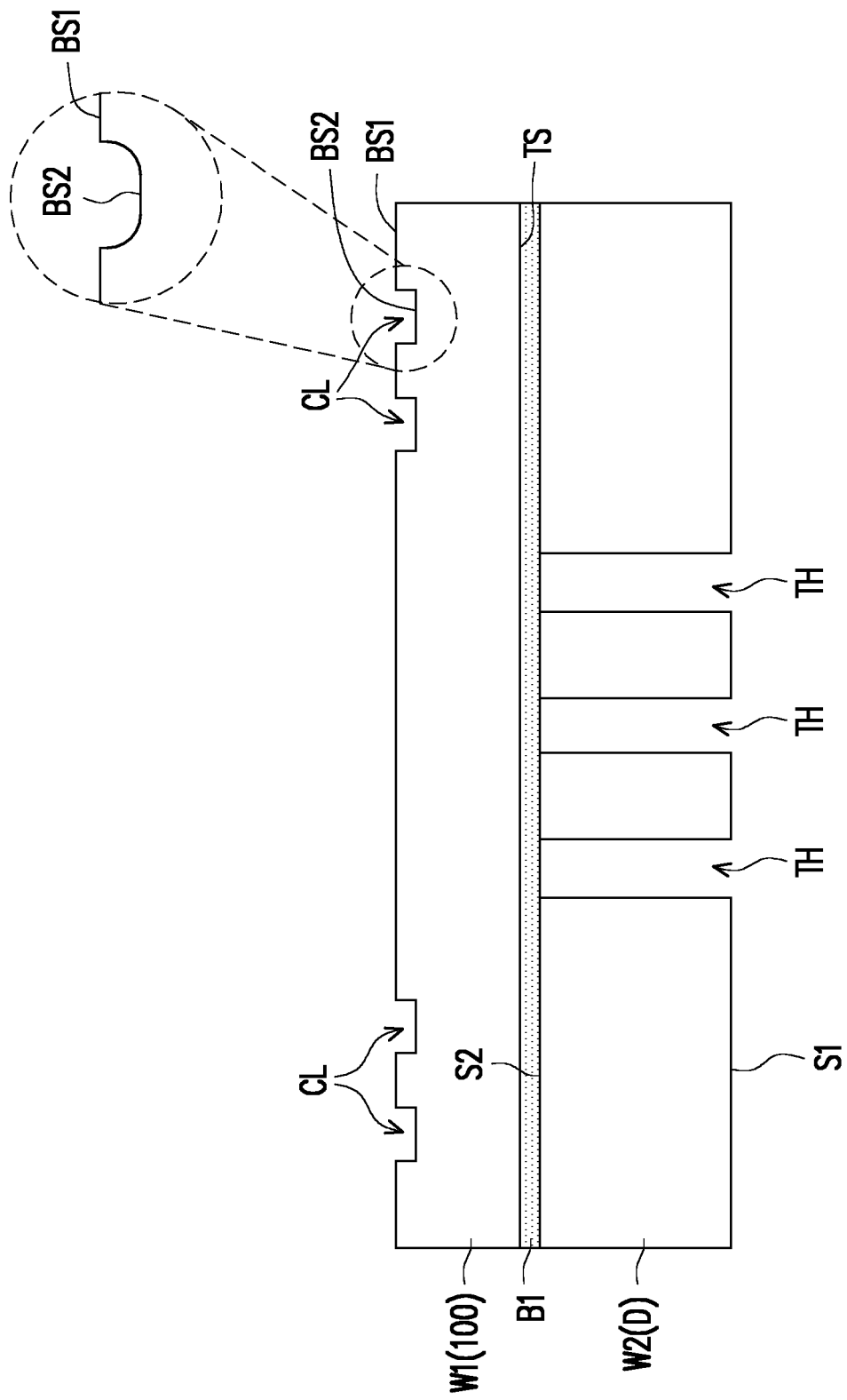
Figure 4C:
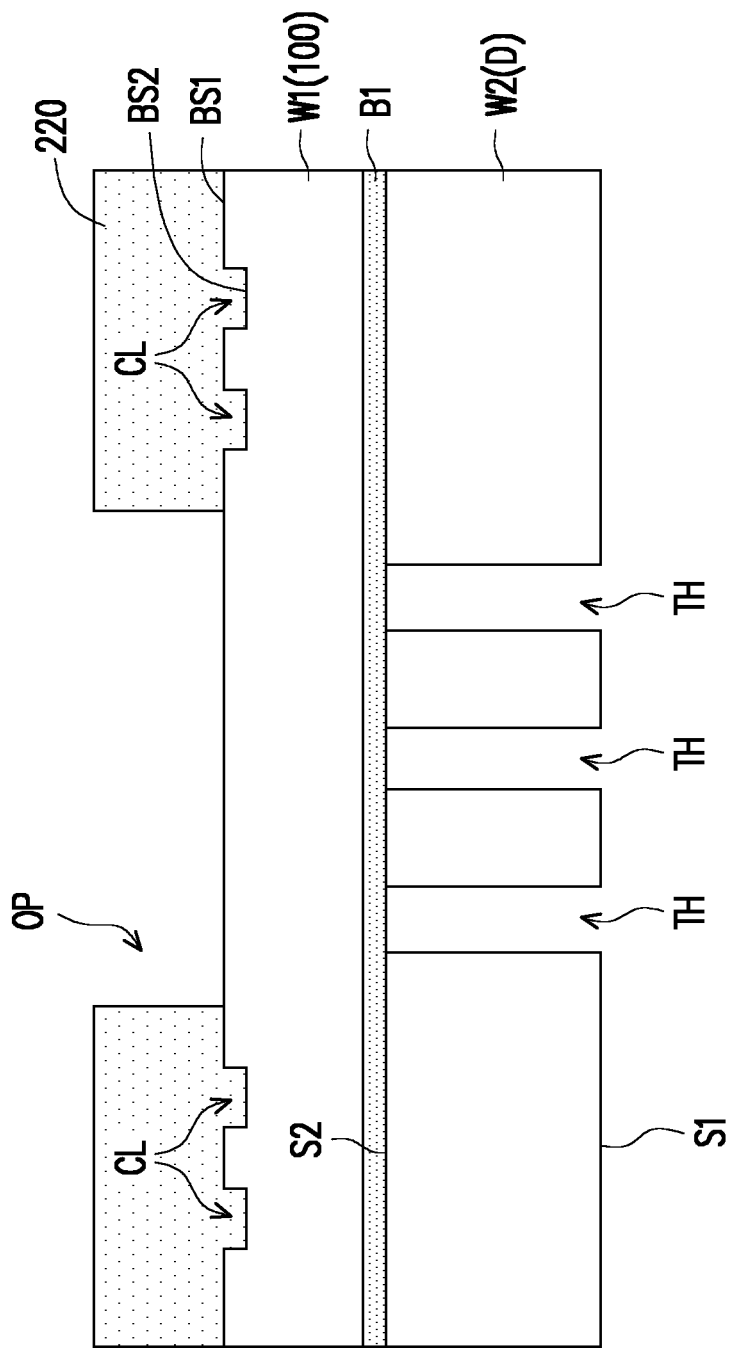
Figure 4D:
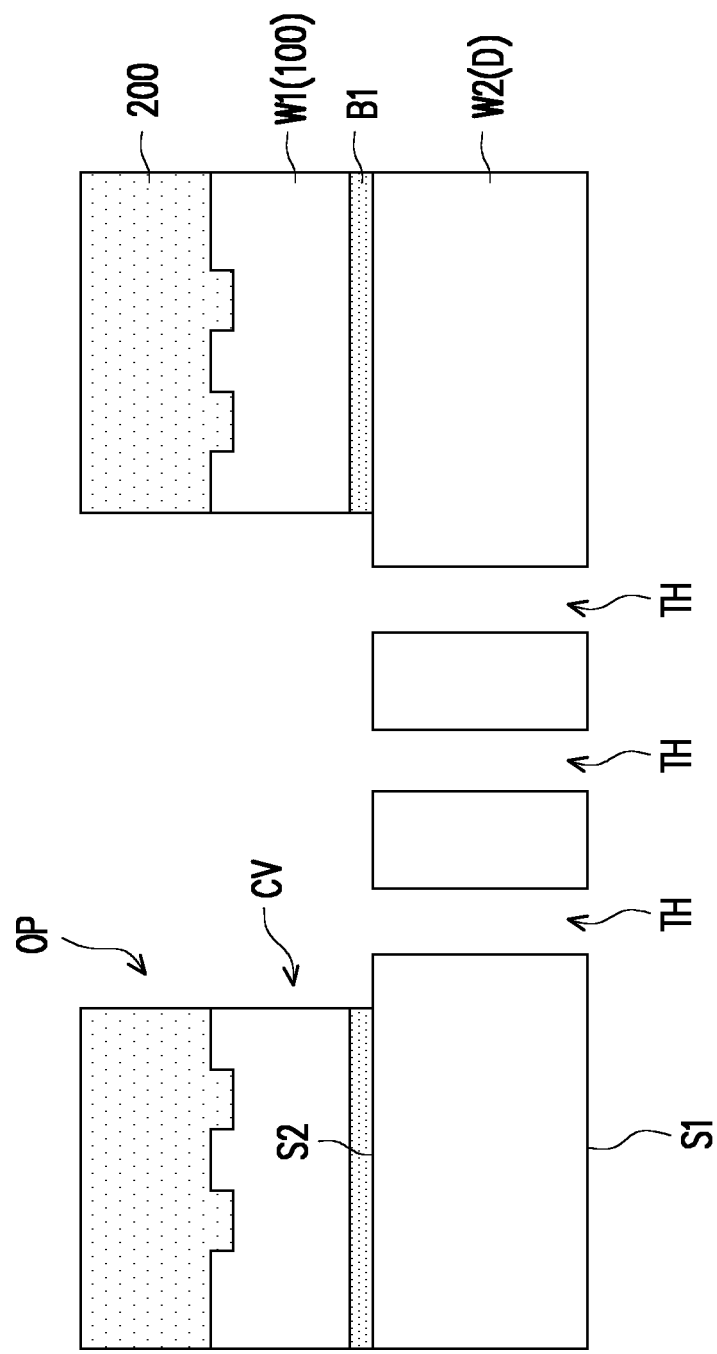
Figure 4E:
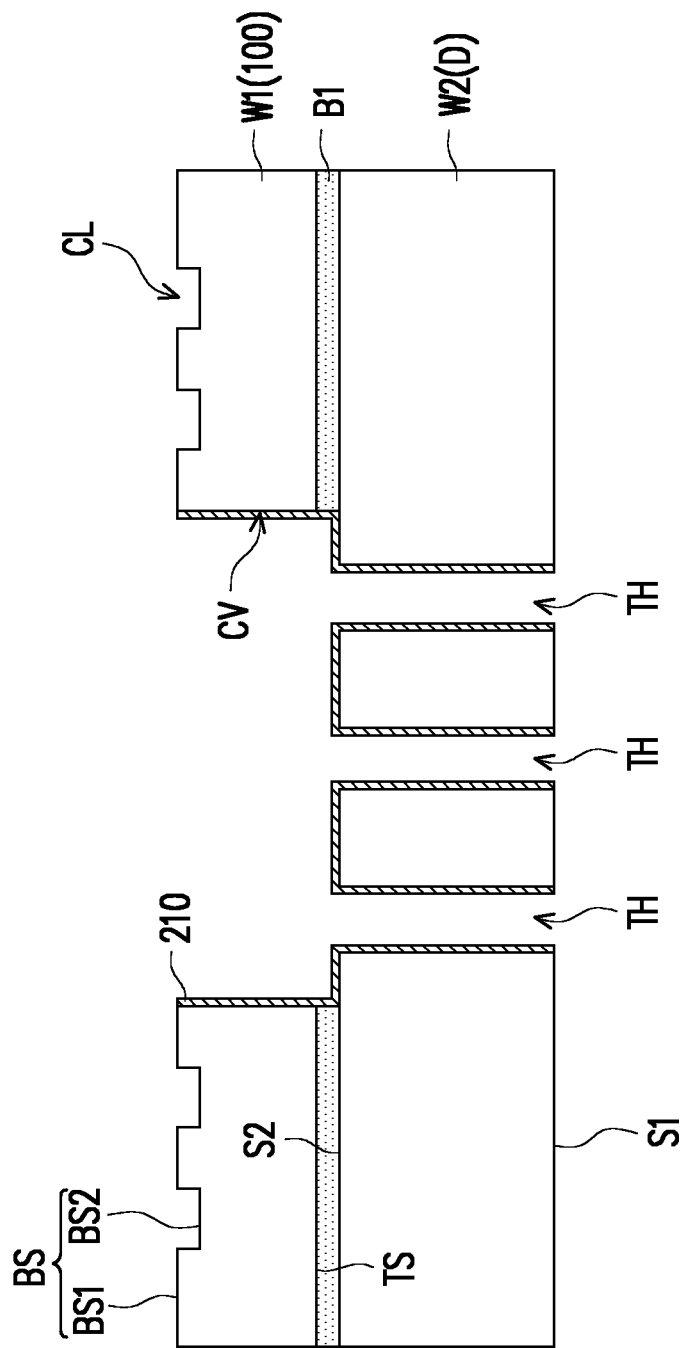
Figure 4F:
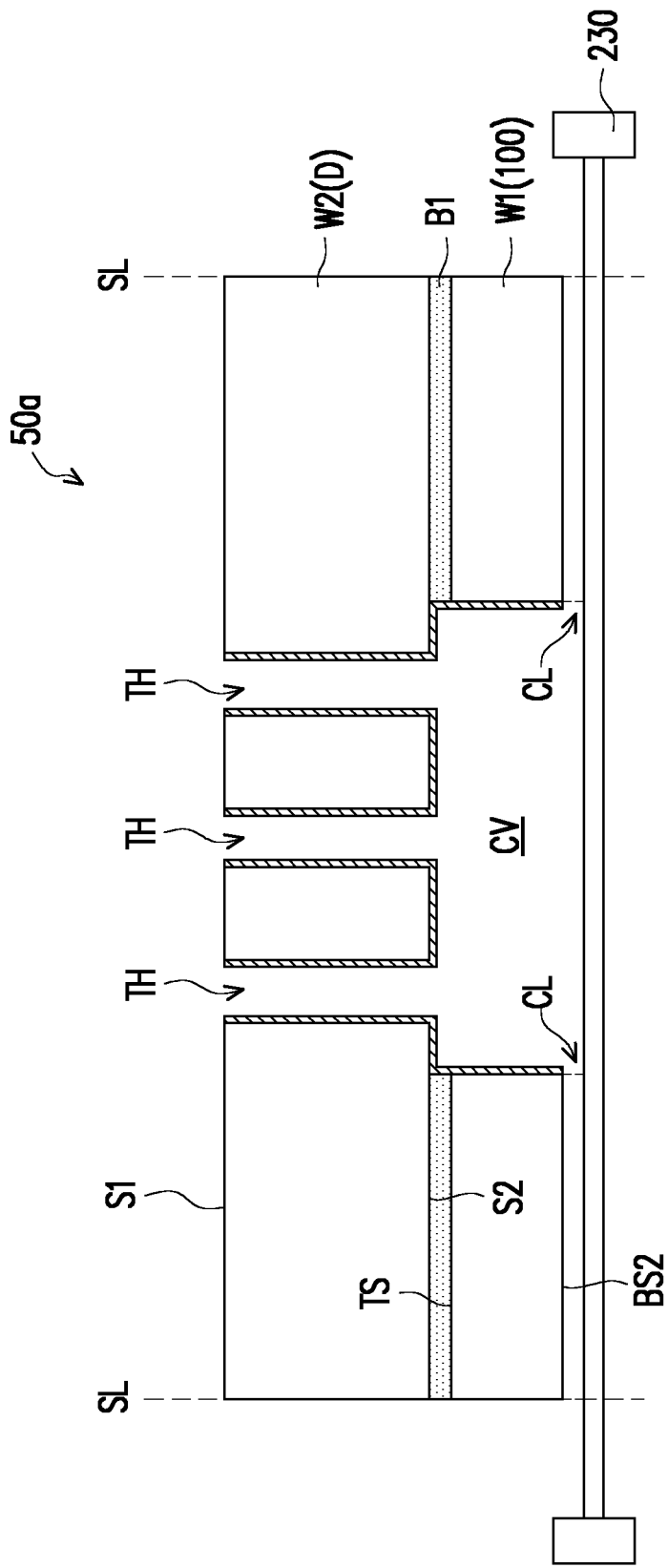
Figure 4G:
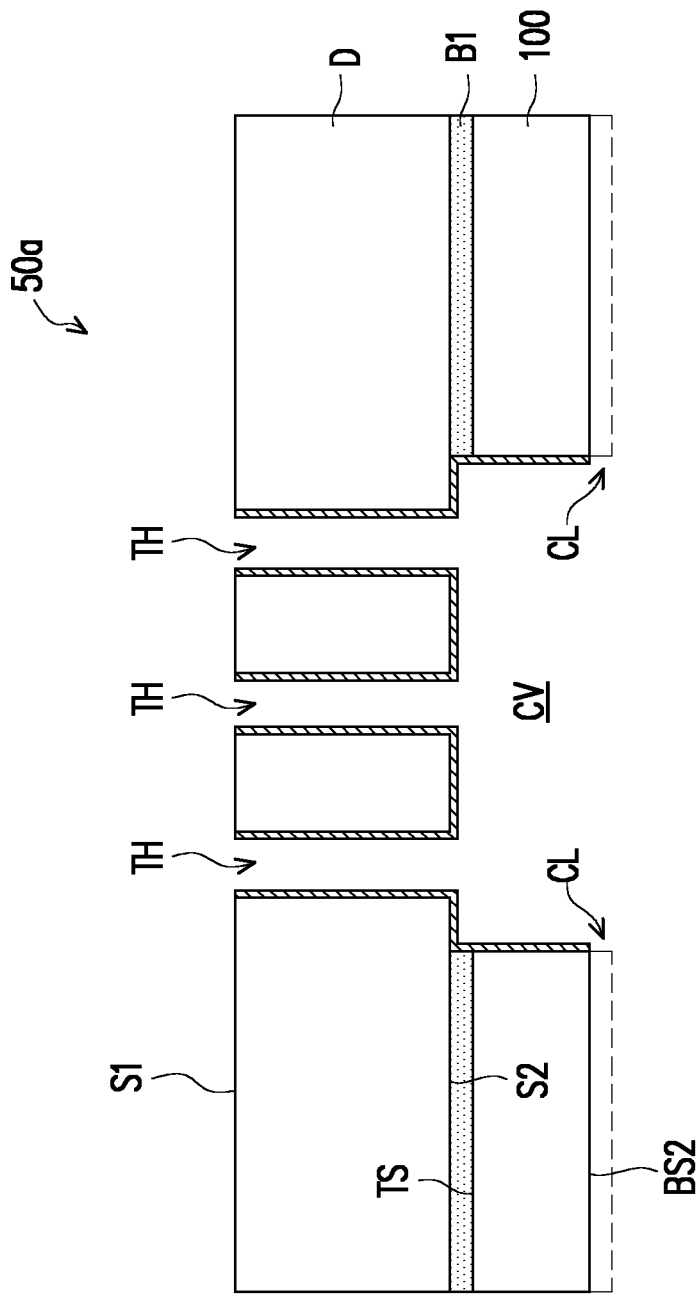

FIG. 4A to FIG. 4G are cross-sectional views illustrating various stages in the manufacturing of the semiconductor device 50a according to some embodiments of the disclosure. FIG. 4A to FIG. 4E are cross-sectional views taken along II-II' line of FIG. 3A, while FIG. 4F and FIG. 4G are cross-sectional views taken along I-I' line of FIG. 3A.

Referring to FIG. 4A, in some embodiments, two wafers W1 and W2 are used for forming the semiconductor device 50a. For example, a wafer W2 is provided, the wafer W2 is a semiconductor wafer including one or more device die D therein. A plurality of device dies D may be arranged as an array in the wafer W2 and spaced from each other by scribe regions (not shown). For the sake of brevity, the detailed components of the wafer W2 are not specifically shown in FIG. 4A to FIG. 4X, and may be referred to those shown and described in FIG. 1.

In some embodiments, a patterning process is performed on the wafer W2 to form a plurality of through holes TH in the dies D. The patterning process may include photolithograph and one or more etching processes. In some embodiments, portions of the passivation layer 207, portions of the dielectric layers of the interconnection structures 206 and portions of the substrate 200 (see FIG. 1) of the dies D are removed by the patterning process. The through holes TH may expose sidewalls of the passivation layer 207, the dielectric layers of the interconnection structures 206 and the substrate 200.

Still referring to FIG. 4A, in some embodiments, after the through holes TH are formed in the dies D of the wafer W2, the wafer W2 is bonded to a wafer W1 by a suitable bonding process, such as fusion bonding process. The wafer W1 may be a semiconductor wafer/substrate, such as a silicon wafer. In some embodiments, the wafer W1 is a bare wafer free of devices formed therein. The wafer W1 may include a plurality of substrate regions 100 corresponding to the dies D of the wafer W2.

In some embodiments, the wafer W2 is bonded to the wafer W1 through a bonding structure B1 including dielectric materials such as silicon oxide, silicon nitride, or silicon oxynitride, or the like, or combinations thereof. In some embodiments, the wafer W2 is bonded to the wafer W1 with the back surface S2 facing the first surface TS. For example, a first bonding film is formed on the first surface TS of wafer W1, and a second bonding film is formed on the second surface S2 of the W2. Thereafter, the wafer W2 having the second bonding film is bonded to the wafer W1 having the first bonding film through a fusion bonding process. In some embodiments, the combination of the wafer W1 and the wafer W2 may be referred to as a wafer structure.

Referring to FIG. 4B, the structure shown in the FIG. 4A is flipped upside down, such that the second surface BS1 of the wafer W1 faces upward. In some embodiments, a patterning process (or referred to as a recessing process) is performed on the wafer W1 to form a plurality of channels CL in the wafer W1. The patterning process removes portions of the wafer W1, so as to recess portions of the wafer W1. The channels CL are defined by recessed surfaces BS2 of the wafer W1. The shapes, configurations, and other features of the channels CL may be referred to the above description with respect to FIG. 1 to FIG. 3.

In some embodiments, the patterning process for forming the channels CL includes performing laser grooving process(es) to remove portions of the wafer W1 (e.g., Si substrate). In alternative embodiments, the patterning process includes performing lithography and etching processes to remove portions of the wafer W1 (e.g., Si substrate). For example, a patterned mask layer (not shown) is formed on the wafer W1. The patterned mask layer has a plurality of openings exposing portions of the second surface BS1 of the wafer W1 at the intended locations of the channels CL. Thereafter, etching process is performed to remove portions of the wafer W1 using the patterned mask layer as an etching mask, so as to form the channels CL. The patterned mask layer is then removed by a suitable process such as ashing or stripping process. In some embodiments, the channels CL are formed to laterally penetrate through the wafer W1 and extend from an edge of the wafer to another edge of the wafer. In alternative embodiments, the channels CL are formed to laterally and partially penetrate through the wafer W1 and extend from an edge of the wafer to a center portion of the wafer W1. In some embodiments, the recessed surface BS2 may be formed to be angled, arced, rounded, or the like.

Referring to FIG. 4C, a pattered mask layer 220 having one or more opening OP is then formed on the wafer W1 for defining cavity (or cavities) in the wafer W1. The patterned mask layer 220 may include a patterned photoresist formed by photolithograph process. In some embodiments, the pattered mask layer 220 covers the channels CL (or at least portions of the channels CL) and portions of the wafer W1 (e.g., the portions directly over edge portions of the dies D) adjacent to the channels CL. The one or more opening OP exposes portions of the wafer W1 at the intended location of the subsequently formed cavity. In some embodiments, the patterned mask layer 220 include a plurality of opening OP, and each opening OP corresponds to one of the dies D of the wafer W2, and exposes a portion of the wafer W1 directly over the through holes TH of the die D.

Referring to FIG. 4D, an etching process is performed using the patterned mask layer 220 as an etching mask, so as to remove portion(s) of the wafer W1 exposed by the opening OP, thereby forming cavity CV in the wafer W1. In some embodiments, the bonding structure S1 underlying the opening OP is also removed by the etching process. The etching process may include an over-etching process to guarantee that the cavity CV extends to spatially connect to the through holes TH. In some embodiments, the over-etching process may remove a small portion of the substrate 200 (FIG. 1) of the wafer W2, such that the cavity CV further extends into the substrate 200 (FIG. 1) wafer W2 to be in spatial communication with the through holes TH. On the other hands, the cavity CV is formed to be in spatial communication with the channels CL in lateral direction (see FIG. 1 to FIG. 3).

Referring to FIG. 4D and FIG. 4E, the patterned mask layer 200 is removed by stripping or ashing process. Thereafter, a liner 210 is formed to cover the surfaces of the cavity CV and the through holes TH. In some embodiments, the liner 210 is formed on the sidewalls of the substrate 100, sidewalls of the bonding structure B1, portions of the surface S2 and sidewalls of the wafer W1 exposed by the cavity CV and the thought holes TH. In some embodiments, the liner 210 may be formed by one or more suitable deposition process (e.g., CVD, PVD, ALD) and/or etching process. In some embodiments, a portion of the liner 210 lining the through holes TH may be formed after forming the through holes TH in the wafer W2 and before bonding the wafer W2 to the wafer W1.

Referring to FIG. 4E to FIG. 4F, in some embodiments, the structure shown in FIG. 4E is disposed on a frame tape 230, and a singulation process is performed along scribe lines SL to form a plurality of separate semiconductor devices 50a. In some embodiments, after the structure is mounted on the frame tape 230 and before and/or after performing the singulation process, additional processes may further be performed on the front side of the die(s) D of the wafer W2. The additional process(es) may include one or more etching process, wet treatment, or the like, for example.

In the embodiments of the disclosure, by forming channels CL at the bottom of the wafer W1, some advantages are achieved. For example, during the above additional process(es), the etchant used for the etching process and/or the cleaning agent (e.g., chemicals) used for wet treatment process may flow into the through holes TH and cavity CV and then flow out of the semiconductor device 50a through the channels CL. Therefore, no residues (e.g., etchant or cleaning chemicals) would remain and accumulate in the cavity CV and/or through hole TH of the semiconductor device 50a, and the damage to the semiconductor device 50a which may be caused by the residues are thus avoided. On the other hand, the channels CL may help to reduce pressure and/or mechanical stress that may be applied on the semiconductor devices 50a. For example, if the channels CL are not formed, the large cavity CV in the wafer W1 may cause vacuum effect, which may adversely affect the adhesion between the semiconductor devices 50a and the frame tape 230, and after the singulation process, the weak adhesion between semiconductor devices 50a and the frame tape 230 may cause movement of the semiconductor devices 50a and collision of adjacent semiconductor devices 50a which may induce mechanical stress on the devices 50a. In the embodiments, through disposing the channels CL at the bottom of the substrate 100, the above issues may be avoided. Accordingly, the performance of the resulted semiconductor device 50a is improved.

Referring to FIG. 4G, the semiconductor device 50a is removed from the frame tape 230 (FIG. 4F).

In the foregoing embodiments, two wafers are bonded together for forming the semiconductor device 50a, and the resulted semiconductor device include two substrates bonded through a bonding structure. However, the disclosure is not limited thereto.

Figure 5A:
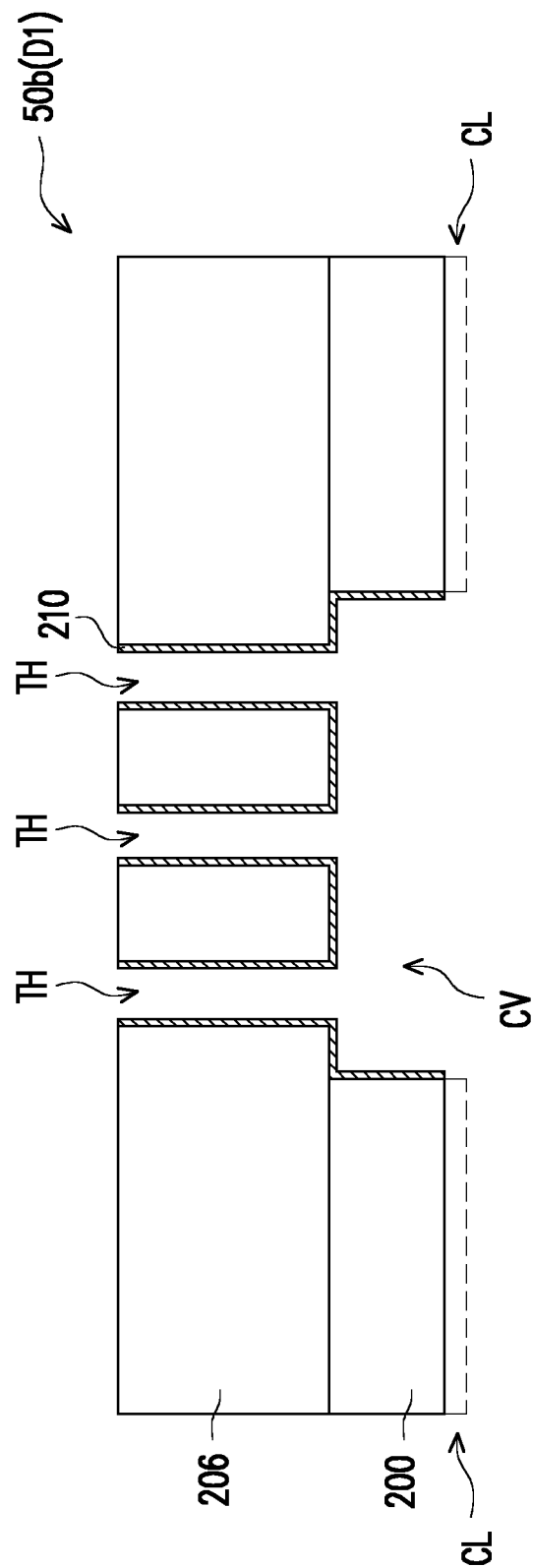
FIG. 5A and FIG. 5B illustrates schematic cross-sectional views of semiconductor devices according to alternative embodiments of the disclosure.
Figure 5B:
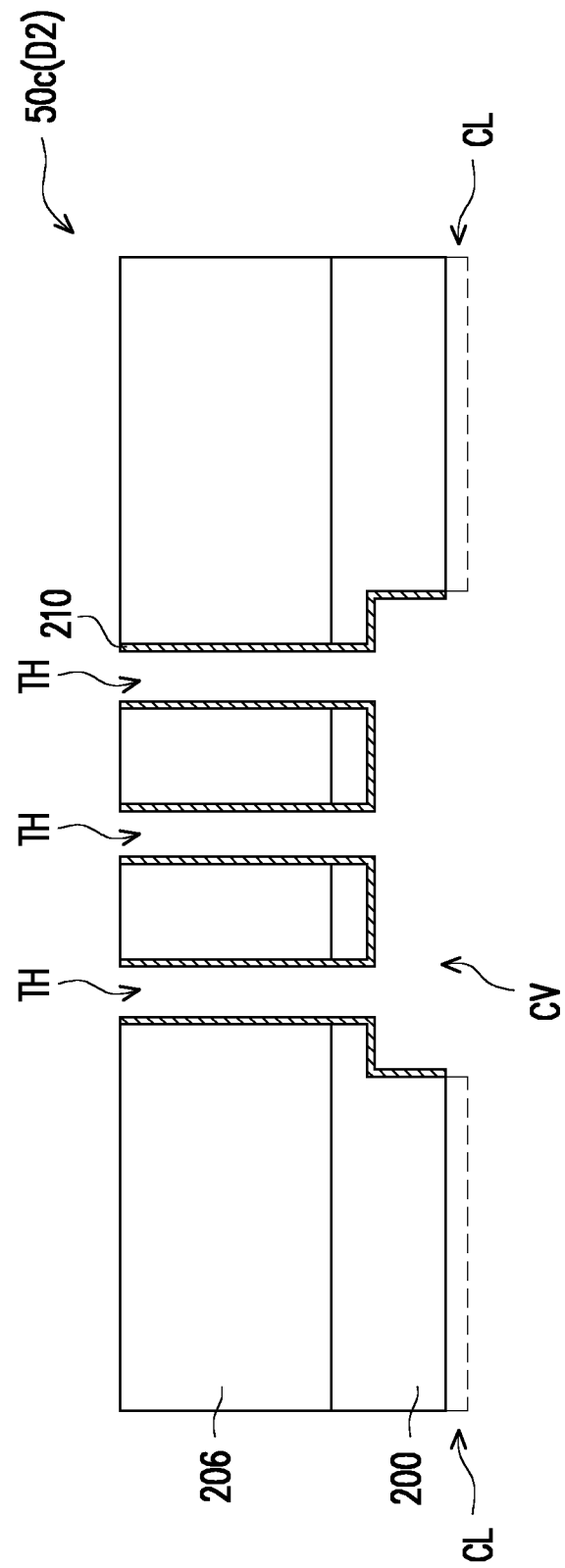

FIG. 5A and FIG. 5B illustrates cross-sectional views of semiconductor devices according to some other embodiments of the disclosure. The current embodiment is similar to the foregoing embodiment, except that one single wafer is used for forming the semiconductor device, and the resulted semiconductor device includes one single substrate. In other words, the lower substrate 100 and the bonding structure B1 (FIG. 4G) are omitted. For the sake of brevity, some components (e.g., passivation layer, connectors) of the semiconductor devices are not specifically shown in FIG. 5A and FIG. 5B, and may be referred to those described and shown in FIG. 1 for the details. Like elements are designated with the same reference numbers for ease of understanding and the details thereof are not repeated herein.

Referring to FIG. 5A, in some embodiments, a semiconductor device 50b includes a substrate 200, an interconnection structure 206 and a passivation layer and a plurality of conductive connectors (not shown) on the interconnection structure 206. The semiconductor device 50b may also be referred to as a die D1 such as a device die including devices formed therein. The materials, components and structures of the die D1 are similar to those of the die D described in FIG. 1, which are not described again here.

The semiconductor device 50b includes a plurality of through holes TH, a cavity CV and a plurality of channels CL in spatial communication with each other. In some embodiments, the through holes TH at least penetrates through the passivation layer and the interconnection structure 206 and may extend from a top surface of the semiconductor device 50b (e.g., a top surface of a passivation layer) to a bottom surface of the interconnection structure 206. The cavity CV may be disposed in the substrate 200 and extend from a top surface of the substrate 200 (or the interface between the substrate 200 and the interconnection structure 206) to a bottom surface of the substrate 200. In other words, the through holes TH may be defined by sidewalls of the dielectric layers of the interconnection structure 206 and sidewalls of passivation layer on the interconnection structure 206. The cavity CV may be defined by sidewalls of the substrate 200 and bottom surface of the interconnection structure 206.

Still referring to FIG. 5A, the channels CL are disposed at the bottom of the substrate 200 and laterally penetrates through the substrate 200. In some embodiments, the channels CL laterally extend from inner sidewalls of the substrate 200 to the outer sidewalls of the substrate 200. The configurations of the channels CL in the substrate 200 are similar to those described with respect to the substrate 100 in the foregoing embodiment, which are not described again here.

The liner 210 lines the surfaces of the through holes TH and the cavity CV. In other words, the liner 210 may cover the sidewalls of passivation layer, sidewalls of dielectric layers of the interconnection structure 206, a portion of a bottom surface of a dielectric layer of the interconnection structure 206 and inner sidewalls of the substrate 200. In some embodiments, the liner 210 is electrically floating.

FIG. 5B illustrates a semiconductor device 50c which may also be referred to as a die D2. The semiconductor device 50c is similar to the semiconductor device 50b, except that the through holes TH further extends into the substrate 200.

Referring to FIG. 5B, in some embodiments, the through holes TH penetrates though the interconnection structure 206 and further partially penetrates through the substrate 200. The through holes TH extends from the top surface of the semiconductor device 50c to a location lower than the bottom surface of the interconnection structure 206 (or the top surface of the substrate 200) and higher than the bottom surface of the substrate 200. The cavity CV partially penetrates through substrate 200 to be in spatial communication with the through holes TH. The cavity CV extends from the bottom surface of the substrate 200 to a location lower than the bottom surface of the interconnection structure 206 (or the top surface of the substrate 200) and higher than the bottom surface of the substrate 200.

In other words, the through holes TH are defined by sidewalls of the passivation layer, sidewalls of dielectric layers of the interconnection structure 206 and sidewalls of the substrate 200. The cavity CV is defined by inner sidewalls of the substrate and an upper surface of the substrate 200 under the topmost surface of the substrate 200 which contacting the interconnection structure 206.

In some embodiments, the semiconductor device 50b or 50c may be formed by the following processes. A semiconductor wafer such as a device wafer W2 is provided. A patterning process is performed from a front side of the semiconductor wafer to form a plurality of though holes TH. In some embodiments, the through holes TH penetrates through the interconnection structure 206 and expose a portion of the top surface of the substrate 200. In alternative embodiments, the through holes TH penetrate through the interconnection structure 206 and further extend into a portion of the substrate 200. Thereafter, a first pattering process is performed on back side of the substrate 200 to form a plurality of channels CL. The first patterning process may include laser grooving process or photolithograph and etching processes. A second patterning process is then performed on back side of the substrate 200 to form a cavity extending from a back surface of the substrate 200 to a location where the cavity CV can be in spatial communication with the through holes TH. In the embodiments in which the through hole TH penetrate through the interconnection structure 206 without extending into the substrate 200, the cavity CV is formed to extend from the back surface of the substrate 200 to the front surface of the substrate 200 to spatially connect to the through holes TH. In alternative embodiments in which the through holes TH further extends into a portion of the substrate 200, the cavity CV is formed to extend from the back surface of the substrate 200 to a location between the front surface and the back surface of the substrate 200 to spatially connect to the through holes TH.

In accordance with some embodiments of the disclosure, a semiconductor device includes at least one substrate and an interconnection structure. The at least one substrate has a cavity partially defined by an inner sidewall of the at least one substrate and a channel disposed at a bottom of the at least one substrate. The channel laterally penetrates through the at least one substrate. The interconnections structure is disposed over the substrate, and the interconnection structure has a through hole penetrating through the interconnection structure. The through hole, the cavity and the channel are in spatial communication with each other.

In accordance with alternative embodiments of the disclosure, a semiconductor device includes a frame and a die disposed on the frame. The frame has a cavity partially defined by an inner sidewall of the frame and a channel disposed at a bottom of the frame and extending from the inner sidewall to an outer sidewall of the frame. The die has a through hole penetrating through the die and spatially connected to the cavity and the channel of the frame.

In accordance with some embodiments of the disclosure, a method of forming a semiconductor device includes: providing a wafer structure, the wafer structure comprises at least one substrate and an interconnection structure disposed on the at least one substrate; forming a through hole in the wafer structure to penetrate through the interconnection structure; performing a first removal process to remove a first portion of the at least one substrate to form a channel in the at least on substrate; performing a second removal process to remove a second portion of the at least one substrate to form a cavity in the at least one substrate, wherein the cavity is in spatial communication with the through hole and the channel; and performing a singulation process on the wafer structure to singulate the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a frame having a cavity partially defined by an inner sidewall of the frame and a channel disposed at a bottom of the frame and extending from the inner sidewall to an outer sidewall of the frame; and
a die, disposed on the frame, wherein the die has a through hole penetrating through the die, wherein the through hole is empty and is in fluid communication with the cavity and the channel of the frame.

2. The semiconductor device of claim 1, wherein the frame has a first bottom surface and a second bottom surface higher than the first bottom surface, the second bottom surface of the frame at least partially define the channel, and the channel laterally penetrates through the frame.

3. The semiconductor device of claim 1, wherein the frame comprises:
a body part bonded to the die; and
a plurality of segments, underlying the body part and spaced from each other by the channel therebetween.

4. The semiconductor device of claim 1, wherein the die comprises:
a substrate, bonded to the frame; and
an interconnection structure disposed on the substrate, wherein the through hole penetrates through the interconnection structure and the substrate.

5. The semiconductor device of claim 1, further comprising an additional channel disposed at the bottom of the frame and extending from the outer sidewall to another outer sidewall of the frame.

6. A semiconductor device, comprising:
a frame having a cavity partially defined by an inner sidewall of the frame and at least one channel disposed at a bottom of the frame and extending from the inner sidewall to an outer sidewall of the frame; and
a die disposed on the frame and comprising a substrate, an interconnection structure disposed over the substrate, and a passivation layer disposed over the interconnection structure, wherein the substrate faces the frame, and a through hole penetrates through the passivation layer, the interconnection structure and the substrate;
wherein the through hole, the cavity and the channel are in spatial communication with each other.

7. The semiconductor device of claim 6, wherein the channel is recessed from a bottommost surface of the frame and toward a top surface of the frame.

8. The semiconductor device of claim 6, wherein the channel is configured for discharging fluid from the through hole and the cavity out of the semiconductor device.

9. The semiconductor device of claim 6, further comprising a conductive liner lining surfaces of the through hole and the cavity.

10. The semiconductor device of claim 6, wherein the through hole further penetrates into a portion of the frame.

11. The semiconductor device of claim 6, further comprising a bonding structure between the frame and the substrate.

12. The semiconductor device of claim 6, wherein the at least one channel comprises a plurality of channels around four sides of the cavity.

13. The semiconductor device of claim 6, wherein the channel has a curved surface.

14. The semiconductor device of claim 6, wherein the at least one channel comprises a plurality of channels configured as a grid pattern.

15. A semiconductor device, comprising:
a frame having a cavity partially defined by an inner sidewall of the frame and a channel disposed at a bottom of the frame and extending from the inner sidewall to an outer sidewall of the frame; and
a die, disposed on the frame, wherein the die has a through hole penetrating through the die and spatially connected to the cavity and the channel of the frame, wherein the frame has a first bottom surface and a second bottom surface higher than the first bottom surface, the second bottom surface of the frame at least partially define the channel, and the channel laterally penetrates through the frame.

16. The semiconductor device of claim 15, wherein the frame comprises:
   a body part bonded to the die; and
   a plurality of segments, underlying the body part and spaced from each other by the channel therebetween.

17. The semiconductor device of claim 15, wherein the die comprises:
   a substrate, bonded to the frame; and
   an interconnection structure disposed on the substrate, wherein the through hole penetrates through the interconnection structure and the substrate.

18. The semiconductor device of claim 17, further comprising a bonding structure between the frame and the substrate.

19. The semiconductor device of claim 15, wherein the channel is configured for discharging fluid from the through hole and the cavity out of the semiconductor device.

20. The semiconductor device of claim 15, wherein the channel has a curved surface.

* * * * *